(12) United States Patent  (10) Patent No.: US 8,951,379 B2
Yamada  (45) Date of Patent: Feb. 10, 2015

(54) TAPE ATTACHING DEVICE AND TAPE ATTACHING METHOD

(75) Inventor: Shingo Yamada, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 175 days.

(21) Appl. No.: 13/702,139

(22) PCT Filed: Jun. 10, 2011

(86) PCT No.: PCT/JP2011/003295
§ 371 (c)(1),
(2), (4) Date: Dec. 5, 2012

(87) PCT Pub. No.: WO2011/158476
PCT Pub. Date: Dec. 22, 2011

(65) Prior Publication Data
US 2013/0075012 A1   Mar. 28, 2013

(30) Foreign Application Priority Data

Jun. 17, 2010 (JP) ................................. 2010-137951

(51) Int. Cl.
*B32B 37/00* (2006.01)
*H05K 13/04* (2006.01)
(Continued)

(52) U.S. Cl.
CPC ................ *H05K 13/04* (2013.01); *B29C 63/02* (2013.01); *H01L 24/27* (2013.01); *H01L 24/29* (2013.01); *H01L 24/743* (2013.01); *H05K 3/323* (2013.01); *H01L 2224/27436* (2013.01); *H01L 2224/2929* (2013.01); *H01L 2224/293* (2013.01);

(Continued)

(58) Field of Classification Search
CPC ............. H01L 21/67132; H05K 3/323; B65H 35/0013
USPC ............ 156/230, 250, 269, 297, DIG. 2, 238, 156/289, 257, 299, 300; 29/831, 832; 427/207.1, 208.2, 208.4
See application file for complete search history.

(56) References Cited

U.S. PATENT DOCUMENTS

2009/0065120 A1* 3/2009 Ueno et al. ...................... 156/64

FOREIGN PATENT DOCUMENTS

| JP | 2001-294361 A | 10/2001 |
| JP | 2008-303028 A | 12/2008 |

OTHER PUBLICATIONS

International Search Report for PCT/JP2011/003295 dated Sep. 6, 2011.

*Primary Examiner* — John Goff
*Assistant Examiner* — Carson Gross
(74) *Attorney, Agent, or Firm* — Pearne & Gordon LLP

(57) ABSTRACT

In the tape attaching method of cutting a tape member into conductive tape pieces and attaching the conductive tape pieces onto a plurality of attachment regions which are formed at a side edge part of a board, an attaching step in which the conductive tape pieces is attached onto the attachment region of a first press position, and a moving step, in which by driving a tape sending mechanism to perform the operation of sending the tape member while a press bonding head and a peeling unit are integrally moved relative to the board, the press bonding head is aligned with the attachment region of a second press position, and a separator is peeled from the tape member attached onto the first press position by the peeling unit during the relative movement, are repeated.

1 Claim, 6 Drawing Sheets

(51) Int. Cl.
  *B29C 63/02* (2006.01)
  *H01L 23/00* (2006.01)
  *H05K 3/32* (2006.01)
  *H01R 4/04* (2006.01)
(52) U.S. Cl.
  CPC . *H01L2224/743* (2013.01); *H01L 2224/83192* (2013.01); *H01L 2224/83851* (2013.01); *H01L 2924/01004* (2013.01); *H01R 4/04* (2013.01); *H05K 2201/10128* (2013.01); *H05K 2201/10446* (2013.01); *H01L 2924/01005* (2013.01); *H01L 2924/01006* (2013.01); *H01L 2924/01019* (2013.01); *H01L 2924/01033* (2013.01); *H01L 24/83* (2013.01); *H01L 2224/83101* (2013.01); *H01L 2924/07811* (2013.01)
  USPC ........... 156/297; 156/230; 156/238; 156/250; 156/257; 156/269; 156/289; 156/299; 29/831; 29/832

(a)

(b)

TAPE ATTACHING DEVICE AND TAPE ATTACHING METHOD

TECHNICAL FIELD

The present invention relates to a tape attaching device and a tape attaching method which attach a tape for mounting components onto a board, such as a display panel.

BACKGROUND ART

In a component mounting operation of mounting components, such as an IC, a TCP (Tape Carrier Package), a COF (Chip on Film) and a FPC (Flexible Printed Circuit), onto a side edge part of a display panel (referred to as a "board" hereafter), a tape attaching operation of attaching an anisotropic conductive tape (Anisotropic Conductive Film: ACF) (hereafter referred to as a conductive tape), which is used as adhesive that contains conductive particles, onto electrode parts provided at the side edge part of the board is performed ahead of a component loading operation.

The tape attaching operation is performed by pressing a tape member in which a conductive tape is laminated on a protective tape, which is called a separator, to the side edge part of the board with a pressing body of an attaching unit, and thereby the conductive tape is attached to the electrode parts. After the attachment, a peeling procedure of peeling the separator from the conductive tape is performed (for example, see a patent document 1). In the related art shown in the patent document, only the separator is peeled by moving horizontally a peeling member which interposes between the attached conductive tape and the separator.

RELATED ART DOCUMENTS

Patent Documents

Patent Document 1: Japan Patent Publication No. 2001-294361

SUMMARY OF THE PRESENT INVENTION

Problems to be Solved by the Present Invention

With the upsizing of television screens in recent years, the size of the to display panel used in televisions tends to be enlarged in both length and width. For this reason, the range in which the conductive tape is attached in the assembly of such a large-sized display panel also increases. However, in the display panel, the electrode parts to which the components are connected are not necessarily formed in the total range of the side edge part of the display panel, but in many cases electrode parts of a prescribed length are spaced and formed discontinuously. When the conductive tape is attached to such a display panel, if the overall conductive tape is attached onto the total range of the side edge part, the conductive tape will be attached even onto a range which would be unnecessary, and the waste of material will be produced.

In order to eliminate the waste, the conductive tape should be attached only in a component connection range in which the electrode parts are formed in the side edge part of the display panel. However, if the tape is attached in such a way, since it is necessary to repeat several times the tape peeling operation after the tape attachment, there are problems that it is hard to avoid that the whole operation time is delayed, and productivity is deteriorated. For this reason, it is desired to improve the efficiency of the tape peeling operation and eliminate the waste of the conductive tape.

The present invention is intended to provide a tape attaching device and a tape attaching method so that a tape peeling operation is efficiently performed while the waste of the conductive tape is eliminated and productivity can be improved.

Means for Solving the Problems

A tape attaching device of the present invention which cuts an anisotropic conductive tape into conductive tape pieces of a predetermined attachment length, and attaches the conductive tape pieces onto a plurality of attachment regions which are formed at a side edge part of a board, comprising a board holding table which holds the board; a tape guiding unit which guides a tape member in which the anisotropic conductive tape is laminated on a separator, from a tape supplying unit to the attachment regions provided at the side edge part of the board along the longitudinal direction thereof, and sends the tape member, which becomes only the separator by attaching the anisotropic conductive tape onto the attachment regions, to a side of a tape collecting unit; a cutting unit which forms the conductive tape pieces by forming breaks at an interval corresponding to the attachment length in the attachment regions on the anisotropic conductive tape; an attaching unit which attaches the anisotropic conductive tape onto the attachment regions by pressing the tape member on the board, which is held on the board holding table and the side edge part of which is received from below by a lower receiving unit, with a press bonding head; a peeling unit which peels the separator from the anisotropic conductive tape attached by the attaching unit; a relative moving unit which horizontally moves the attaching unit and the peeling unit relative to the board holding table in a state that a relative position of the attaching unit and the peeling unit is kept; and a control unit which controls the relative moving unit, the tape guiding unit, the cutting unit, the attaching unit, and the peeling unit; wherein the control unit makes sending operation of the tape member to be performed by the tape guiding unit in synchronization with the relative movement with the relative moving unit.

A tape attaching method of the present invention which cuts an anisotropic conductive tape into conductive tape pieces of a predetermined attachment length, and attaches the conductive tape pieces onto a plurality of attachment regions which are formed at a side edge part of a board, and which is performed by a tape attaching device comprising a board holding table which holds the board, a tape guiding unit which guides a tape member in which the anisotropic conductive tape is laminated on a separator, from a tape supplying unit to the attachment regions provided at the side edge part of the board along the longitudinal direction thereof, and sends the tape member, which becomes only the separator by attaching the anisotropic conductive tape onto the attachment regions, to the side of a tape collecting unit, a cutting unit which forms breaks at an interval corresponding to the attachment length in the attachment regions on the anisotropic conductive tape, an attaching unit which attaches the anisotropic conductive tape onto the attachment regions by pressing the tape member on the board, which is held on the board holding table and the side edge part of which is received from below by a lower receiving unit, with a press bonding head, a peeling unit which peels the separator from the anisotropic conductive tape attached by the attaching unit, a relative moving unit which horizontally moves the attaching unit and the peeling unit relative to the board holding table in a state that a relative position of the attaching unit and the peeling unit is kept, and a control unit which controls the relative moving unit, the tape guiding unit, the cutting unit, the attaching unit, and the peeling unit, the tape attaching method comprising an attaching step in which the conductive tape piece is attached onto one attachment region; and a moving step in which after the press bonding head is moved up, while the attaching unit and the peeling unit are integrally moved relative to the board holding table by driving the relative moving unit, the tape guiding unit is driven to perform the operation of sending the tape member, so that the press bonding head is aligned with the next attachment region and the separator is peeled from the anisotropic conductive tape attached onto the attachment region by the peeling unit during the relative movement; wherein the attaching step and the moving step are repeated.

Effect of the Present Invention

According to the present invention, in the tape attaching method of cutting the anisotropic conductive tape into conductive tape pieces of a predetermined attachment length and attaching the conductive tape pieces onto the plurality of attachment regions which are formed at the side edge part of the board, the attaching step in which one conductive tape piece is attached on one attachment region, and the moving step, in which by driving the tape guiding unit to perform the operation of sending the tape member while the attaching unit and the peeling unit are integrally moved relative to the board holding table, the press bonding head is aligned with the next attachment region, and the separator is peeled from the anisotropic conductive tape attached onto the attachment region by the peeling unit during the relative movement, are repeated. Thus, the tape peeling operation is efficiently performed while the waste of the conductive tape is eliminated, and productivity can be improved.

EMBODIMENTS OF THE PRESENT INVENTION

Next, an embodiment of the present invention is described with reference to the figures. First, the construction of a tape attaching device 1 is described with reference to FIGS. 1 and 2. In a component mounting device which mounts components for a driver or the like on a side edge part of a board, such as a display panel, the tape attaching device 1 has a function of cutting an anisotropic conductive tape (hereafter only called an "conductive tape" in brief), which is used to bond the components to the side edge part and electrically connect the components to electrode parts, into conductive tape pieces of a predetermined attachment length ahead of a component loading operation, and attaching the conductive tape pieces to a plurality of attachment regions which are formed on the side edge part of the board.

Figure 1:
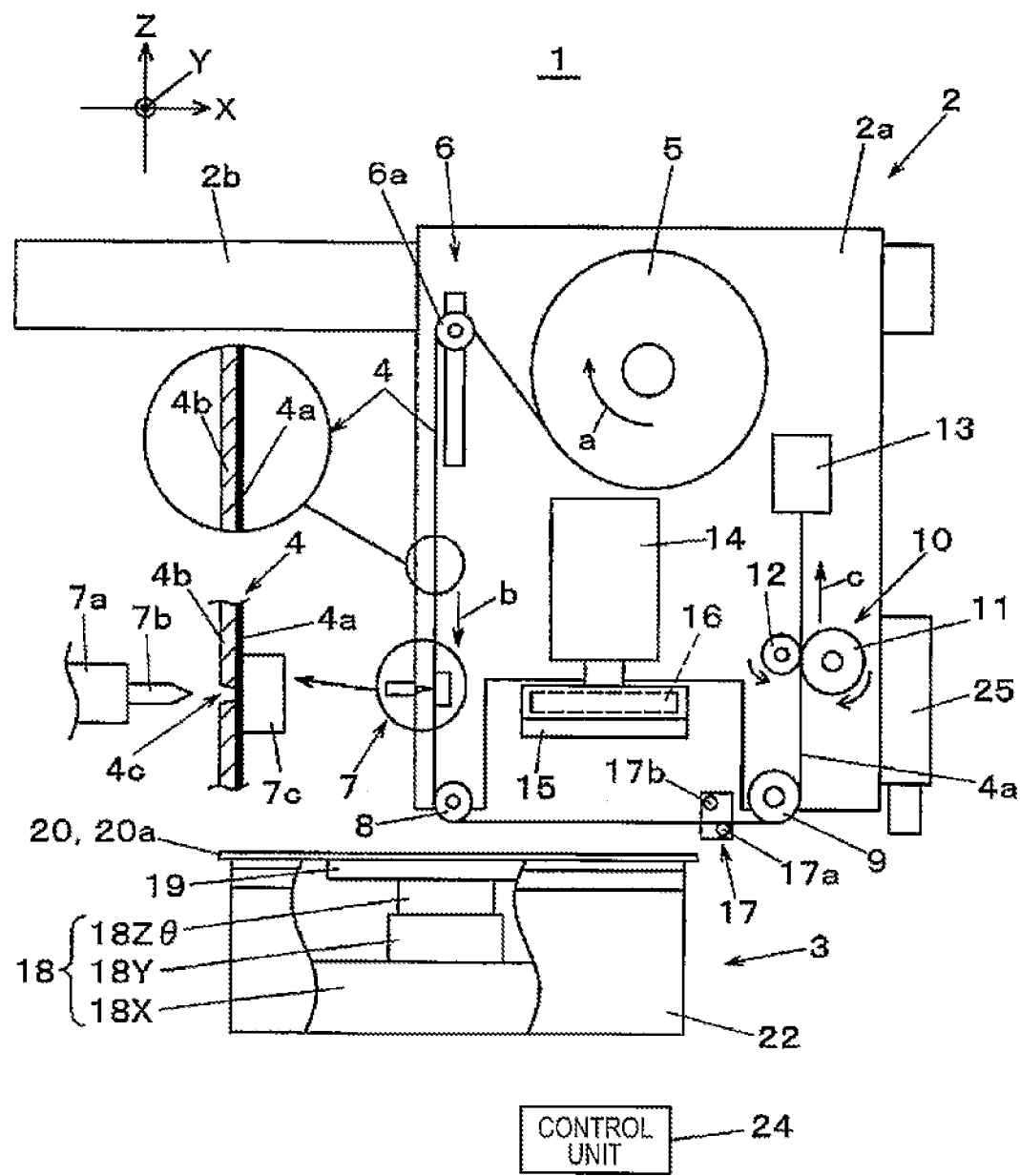
FIG. 1 is a front view of a tape attaching device of one embodiment of the present invention.
Figure 2:
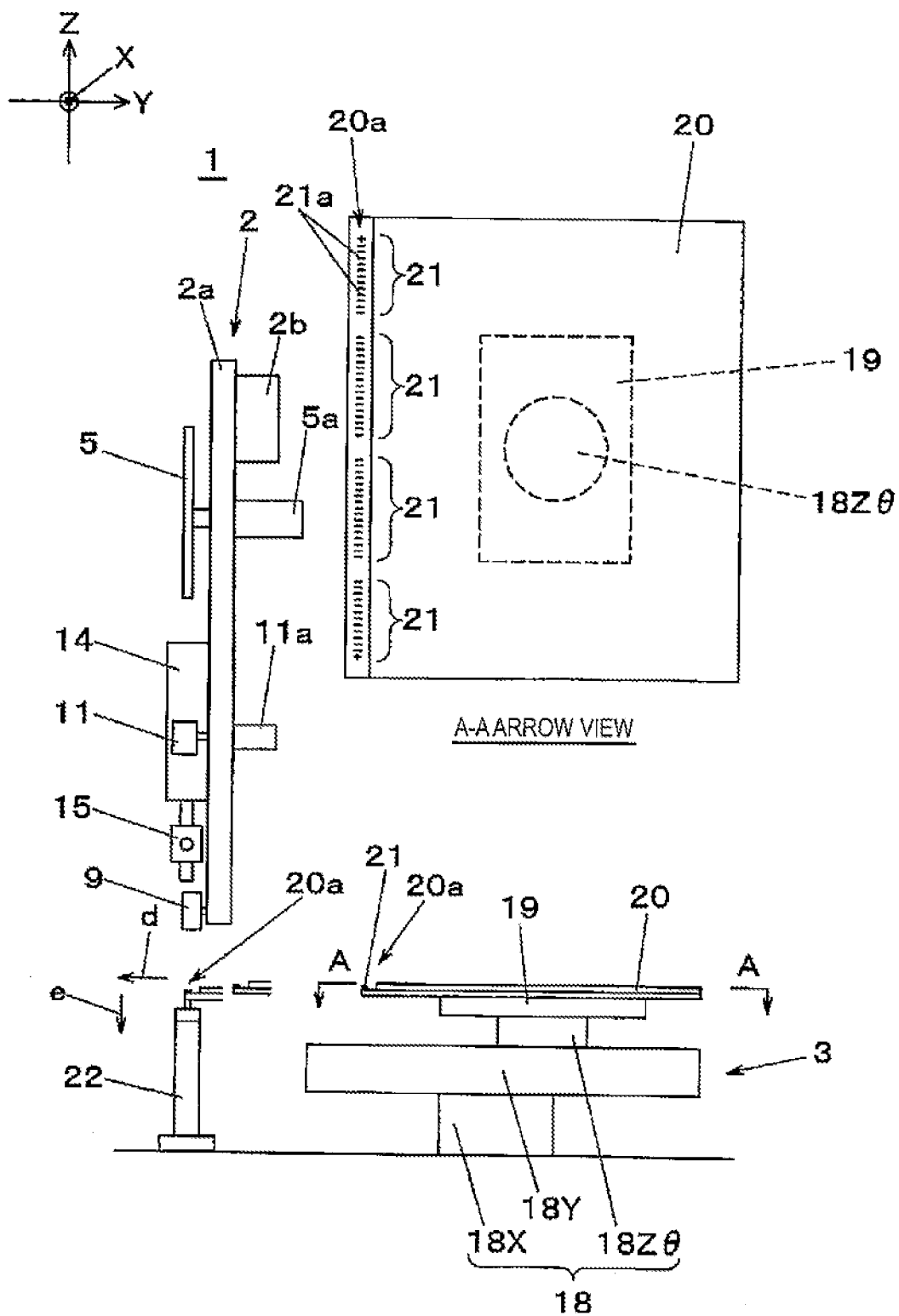
FIG. 2 is a side view of the tape attaching device of the embodiment of the present invention.

In FIGS. 1 and 2, the tape attaching device 1 has such a construction that a board positioning unit 3, which positions the board on which the attachment is made, is disposed below an attaching mechanism 2 which has a function of supplying and attaching the conductive tape. The attaching mechanism 2 is based on a vertical plate-like base plate 2a which is movable in the X direction with an attachment unit moving mechanism 2b, and a tape supply reel 5 is disposed at the upper unit of the base plate 2a. The tape supply reel 5 winds and stores a tape member 4 which is formed by laminating a conductive tape 4b onto a separator 4a, and is rotated by a reel driving mechanism 5a (refer to FIG. 2) which is disposed on the back surface of the base plate 2a.

When the reel driving mechanism 5a is driven, the tape supply reel 5 is rotated in the direction of arrow a, and the wound and stored tape member 4 is unwound and guided (arrow b) around a tension roller 6a of a tension giving mechanism 6 and downwards. The tension giving mechanism 6 has a function of giving a predetermined tension to the tape member 4 so that slack may not occur in the unwound tape member 4. The tape supply reel 5 and the reel driving mechanism 5a construct a tape supplying unit which supplies the tape member 4.

A first guide roller 8 and a second guide roller 9 are horizontally disposed at both sides of the lower end unit of the base plate 2a, and a tape sending mechanism 10 and a tape collecting unit 13 are further disposed above the second guide roller 9. The horizontal unit between the first guide roller 8 and the second guide roller 9 is an attachment position where the conductive tape 4b is attached onto attachment regions 23 (refer to FIGS. 3(a) and 3(b)) of the board 20 by an attaching unit to be described later. The tape member 4, which is unwound from the tape supply reel 5 and goes through the tension giving mechanism 6, is guided around the first guide roller 8 and horizontally with the conductive tape 4b downwards, and in the attachment position, only the conductive tape 4b at the lower side in the tape member 4 is attached onto the attachment regions 23 of the board 20.

The tape member 4, which becomes only the separator 4a since the conductive tape 4b is attached onto the attachment regions 23 of the board 20, is guided around the second guide roller 9 and upwards by the tape sending mechanism 10 (arrow c), and collected by the tape collecting unit 13. The tape sending mechanism 10 is provided with a driving roller 11 and an idle roller 12 which hold the separator 4a to send upwards, and the driving roller 11 is rotated by a roller driving mechanism 11a (refer to FIG. 2) which is disposed at the back surface side of the base plate 2a. The tape sending mechanism 10, the first guide roller 8 and the second guide roller 9 are a tape guiding unit which guides the tape member 4, which is formed by laminating the conductive tape 4b on the separator 4a, from the tape supplying unit to the attachment regions 23 which are provided at the side edge part 20a of the board 20 along the longitudinal direction, and sends the tape member 4, which becomes only the separator 4a since the conductive tape 4b is attached onto the attachment regions 23 of the board 20, to the side of the tape collecting unit 13.

A cutting unit 7 is disposed in a feeding course of the tape member 4 from the tension giving mechanism 6 to the first guide roller 8. The cutting unit 7 has such a construction that a cutter blade 7b is moved back and forth relative to the conductive tape 4b by a blade driving mechanism 7a. In a state that the back surface side of the separator 4a is supported by a receiving member 7c, by moving the cutter blade 7b back and forth relative to the tape member 4, only the conductive tape 4b in the tape member 4 is cut, and a break 4c is formed. The break 4c defines the range of the conductive tape 4b attached in one tape attachment, i.e., an attachment length. That is, the cutting unit 7 forms breaks 4c in the conductive tape 4b at an interval corresponding to the attachment length L (refer to FIG. 3 (b)) at the attachment regions 23 of the board 20. The break 4c corresponds to an attachment starting position S of the conductive tape 4b, and in the tape attaching operation, the position of the break 4c is aligned with an attachment starting end 23a of the attachment region 23 (refer to FIG. 4 (b)).

A press bonding head 15 which is moved up and down by an elevating mechanism 14 is disposed between the first guide roller 8 and the second guide roller 9 and above the feeding course of the tape member 4 in the horizontal direction (X direction), and under the press bonding head 15, a lower receiving unit 22 is disposed to be opposed to the press bonding head 15. Furthermore, the board positioning unit 3, which has such a construction that a board holding table 19 is moved by a board moving mechanism 18, is disposed at the back surface side of the lower receiving unit 22 in the Y direction. The board holding table 19 holds the board 20 on which the attachment is made. As shown in FIG. 2, the board 20 has a construction of laminating two glass boards together, and at a side edge part 20a where the lower glass board is exposed partially, as shown in an A-A arrow view, a plurality of (in this embodiment, four) electrode parts 21 which include a plurality of terminals 21a for component connection are formed into a line shape along the longitudinal direction of the side edge part 20a.

The board moving mechanism 18 is formed by laminating an X axis table 18X, a Y axis tables 18Y, and a Zθ axis table 18Zθ from below, and the board holding table 19 is combined on the top surface of the Zθ axis table 18Zθ. By driving the board moving mechanism 18, the board holding table 19 which holds the board 20 is moved in the X direction, the Y direction, the Z direction, and the direction of θ. Thereby, the attachment regions 23 of the side edge part 20a of the board 20 can be positioned to the attachment position of the press bonding head 15.

Namely, the side edge part 20a of the board 20 is moved in the Y direction by the Y axis table 18Y (arrow d), and is placed under the press bonding head 15. Furthermore, the side edge part 20a is moved down by the Zθ axis table 18Zθ (arrow e), and thereby the back surface of the side edge part 20a is received from below by the receiving surface of the top end surface of the lower receiving unit 22. In a state that the back surface of the side edge part 20a is separated from the receiving surface of the top end surface of the lower receiving unit 22, by driving the X axis table 18X, the side edge part 20a of the board 20 is moved in the X direction, and the attachment regions 23 which are set along the side edge part 20a can be made to oppose to the press bonding head 15. That is, the board moving mechanism 18 at least moves the board holding table 19 in the X direction which is along the side edge part 20a of the board 20. It is also possible that the receiving operation of contacting the back surface of the side edge part 20a of the board 20 with the receiving surface of the top end surface of the lower receiving unit 22, and the operation of detaching the back surface of the side edge part 20a from the receiving surface of the top end surface of the lower receiving unit 22, are performed by moving the lower receiving unit 22, which becomes movable in the up-down direction, in the up-down direction.

In the tape attachment of the press bonding head 15, in a state that the tape member 4, in which the conductive tape 4b to be attached is at the lower side, is located above the side edge part 20a, while the press bonding head 15 is dropped by the elevating mechanism 14 to press the tape member 4 with a predetermined load onto the attachment region of the side edge part 20a, the tape member 4 is heated with a heater 16 which is provided in the press bonding head 15. Thereby, a conductive tape piece 4b* covers an electrode part 21, and is attached to the electrode part 21. A camera 25 is installed at the side end of the base plate 2a with a downwards imaging direction, and the camera 25 images the conductive tape piece 4b* attached onto the electrode part 21 from above. By recognizing this imaging result, the quality of the attachment of the conductive tape piece 4b* is inspected.

Figure 3:
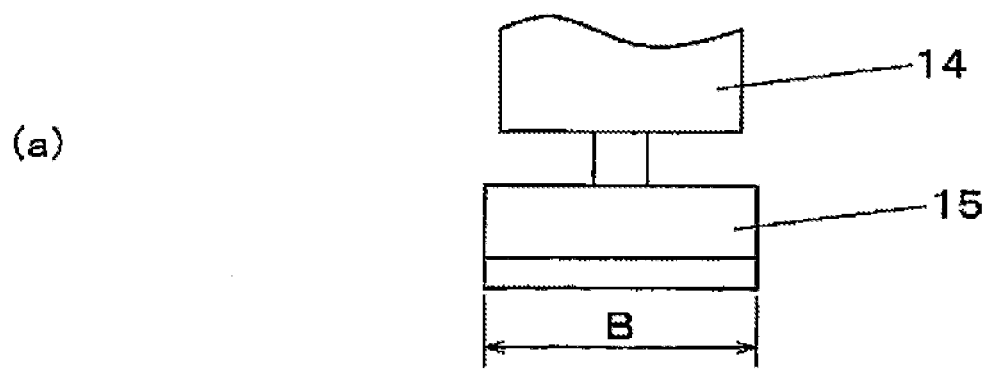
FIGS. 3(a) and 3(b) are explanatory views of the attachment length of an anisotropic conductive tape on a board which is the object of the tape attaching device of the embodiment of the present invention.
Figure 3:
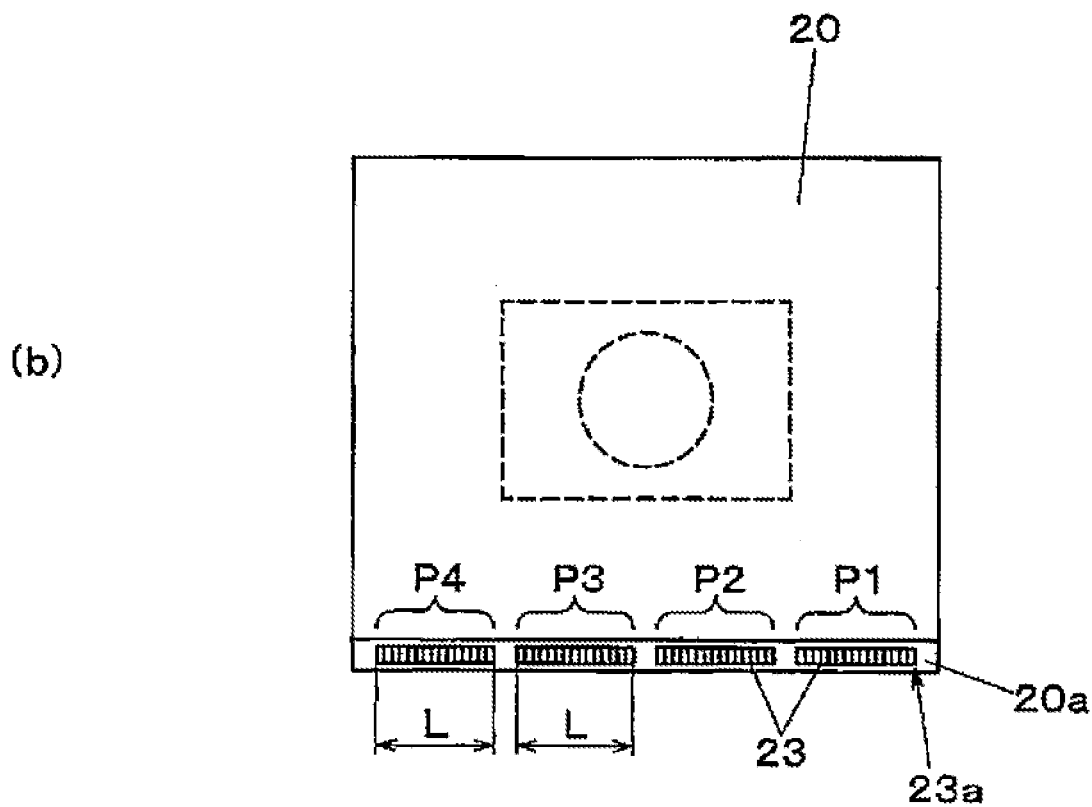

With reference to FIGS. 3(a) and 3(b), the relation between the press length of the press bonding head 15 and the attachment length of the attachment region of the board 20 is described. As shown in FIG. 3 (a), the press bonding head 15 of a press length B in which the tape member 4 is pressed is attached to the elevating mechanism 14 shown in this embodiment. As shown in FIG. 3 (b), the position of the electrode part 21 in the side edge part 20a of the board 20 on which the attachment is made, in other words, the length L of the attachment region 23 of the conductive tape 4b on the board 20 is somewhat shorter than the press length B of the press bonding head 15, and the total range of one conductive tape piece 4b* can be covered with one pressing operation of the press bonding head 15.

In this embodiment, conductive pieces 4b* are sequentially attached onto the attachment regions 23 by pressing the press bonding head 15 to a first press position P1, a second press position P2, a third press position P3, and a fourth press position P4 respectively corresponding to four electrode parts 21. The elevating mechanism 14 and the press bonding head 15 construct an attaching unit which attaches the conductive tape pieces 4b* on the attachment regions 23 of the board 20 by pressing the tape member 4, in which the conductive tape 4b is laminated onto the separator 4a, on the board 20, which is held at the board holding table 19 and the side edge part 20a of which is received from below by the lower receiving unit 22, with the press bonding head 15.

In FIG. 1, at the side of the second guide roller 9 towards the central unit, a peeling unit 17 is disposed at a fixed position of the attaching mechanism 2, and the relative position of the peeling unit 17 and the attaching unit is always kept the same. The peeling unit 17 includes two peeling rollers, that is, a first peeling roller 17a that is placed below the separator 4a which is fed horizontally, and a second peeling roller 17b that is placed above the separator 4a, and has a function of peeling the separator 4a from the conductive tape 4b attached by the attaching unit.

Namely, as shown in FIG. 5(b), in a state that the first peeling roller 17a is placed between the conductive tape 4b attached onto the side edge part 20a of the board 20 and the separator 4a, by driving the attachment unit moving mechanism 2b to horizontally move the peeling unit 17 in the X direction relative to the board 20 together with the base plate 2a, the first peeling roller 17a advances into the interface of the conductive tape 4b and the separator 4a of the tape member 4, and the separator 4a is peeled from the conductive tape 4b attached onto the side edge part 20a of the board 20. At this time, by sending the tape member 4 with the tape sending mechanism 10 in synchronization with the horizontal movement of the peeling unit 17, the peeled separator 4a can be collected without producing slack in the separator 4a after the peeling. The second peeling roller 17b becomes movable up and down in the peeling unit 17, and in the tape attachment of the press bonding head 15, the second peeling roller 17b can be moved up and down together with the press bonding head 15, relative to the tape member 4 in which the conductive tape 4b pressed onto the side edge part 20a of the board 20 is laminated.

Therefore, the attachment unit moving mechanism 2b becomes a relative moving unit which horizontally moves the attaching unit and the peeling unit 17 relative to the board holding table 19 when a relative position of the attaching unit and the peeling unit 17 is kept. It is also possible, by horizontally moving the board holding table 19 in the X direction with the board moving mechanism 18 instead of horizontally moving the base plate 2a with the attachment unit moving mechanism 2b in the attaching mechanism 2, to make the attaching unit and the peeling unit 17 to be horizontally moved relative to the board holding table 19 in a state that a relative position of the attaching unit and the peeling unit 17 is kept. In this case, the board moving mechanism 18 constructs the relative moving unit.

The operations of the attachment unit moving mechanism 2b, the cutting unit 7, the tape sending mechanism 10, the elevating mechanism 14, the press bonding head 15, the peeling unit 17, and the board moving mechanism 18 are controlled by a control unit 24. At this time, the tape peeling is performed when the control unit 24 makes the sending operation of the tape member to be performed with the tape sending mechanism 10 in synchronization with the relative movement of the board holding table 19 and the peeling unit 17 with the attachment unit moving mechanism 2b, and thereby the tape attaching operation to be described below is performed. Below, with reference to FIGS. 1, 3(a), 3(b), 4(a), 4(b), 4(c), 5(a), 5(b), 5(c) and FIG. 6, a tape attaching method is described with which the tape attaching device 1 cuts the conductive tape 4b to conductive tape pieces 4b* of a predetermined attachment length, and attaches the conductive tape pieces 4b* onto a plurality of attachment regions 23 which are formed at the side edge part 20a of the board 20.

Figure 4:
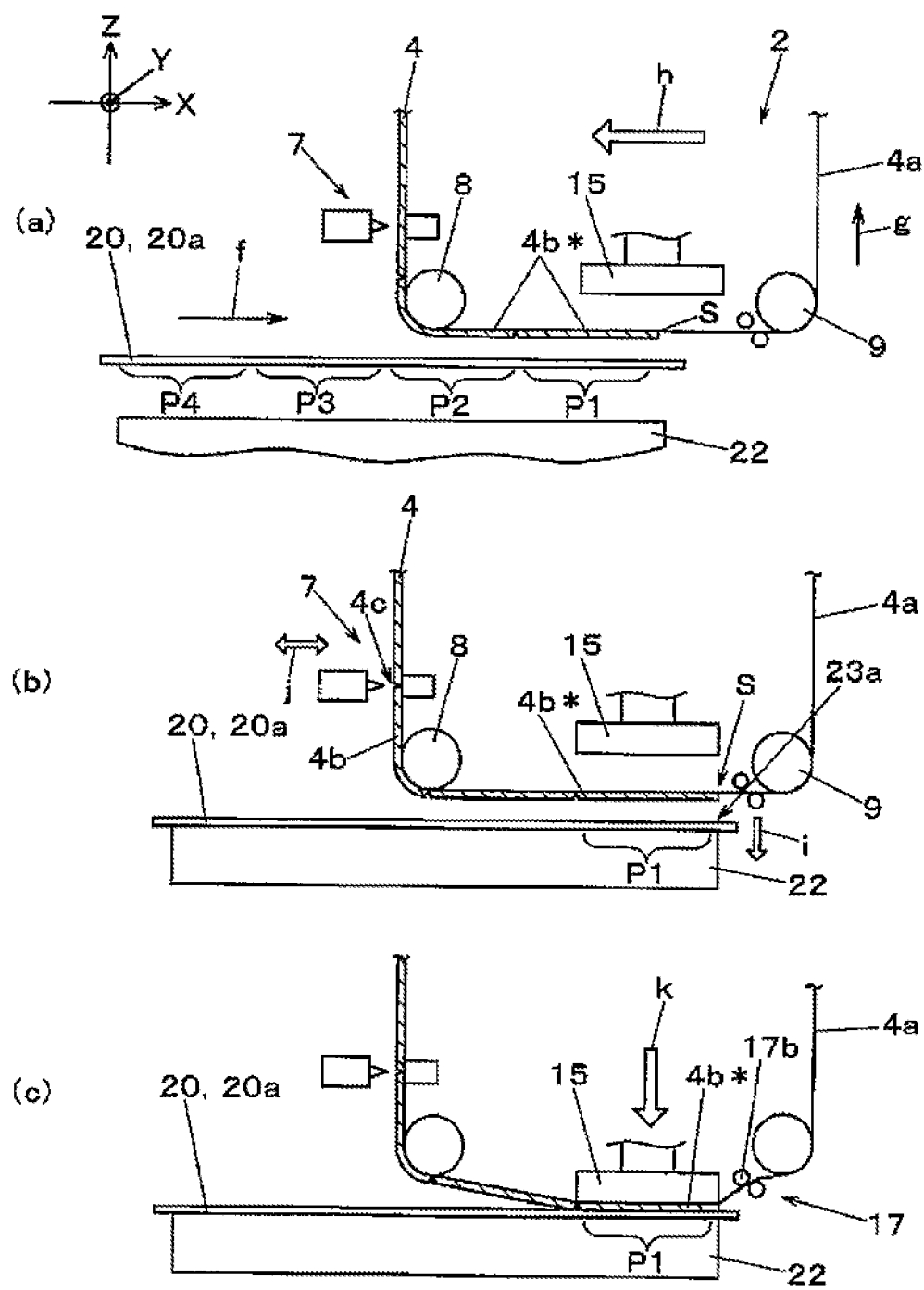
FIGS. 4(a), 4(b) and 4(c) are procedure illustrations of a tape attaching method of the embodiment of the present invention.

First, as shown in FIG. 4 (a), while the side edge part 20a of the board 20 held on the board holding table 19 is moved above the lower receiving unit 22 (arrow f) and is aligned by the board moving mechanism 18, the attaching mechanism 2 is moved (arrow h) and the first press position P1 which is set at the side edge part 20a and the press bonding head 15 are aligned with a predetermined position of the lower receiving unit 22. Meanwhile, by driving the tape sending mechanism 10 to send the tape member 4 (the arrow g), a feeding operation is performed which aligns the attachment starting position S of a first conductive tape piece 4b* among the conductive tape pieces 4b* formed previously with the first press position P1.

Next, as shown in FIG. 4 (b), by driving the Zθ axis table 18Zθ to drop the board holding table 19, the board 20 is dropped (arrow i) so that the back surface of the side edge part 20a is received from below by the lower receiving unit 22. In this state, the press bonding head 15 is in a position where the conductive tape piece 4b* is pressed to the first press position P1 of the side edge part 20a, and the attachment starting position S of the conductive tape piece 4b* is aligned with the attachment start end 23a of the first press position P1. Herein, the attachment starting position S of the conductive tape piece 4b* corresponds to the break 4c formed in the conductive tape 4b by the cutting unit 7. In this state, a break 4c is newly formed in the tape member 4 by operating the cutting unit 7 (arrow j).

Next, as shown in FIG. 4 (c), by dropping the press bonding head 15 (arrow k), the conductive tape piece 4b* is pressed to the first press position P1, and is attached onto the corresponding attachment region 23 (one attachment region) (attachment step). At this time, the second peeling roller 17b of the peeling unit 17 is dropped with the press bonding head 15. However, the dropping of the second peeling roller 17b is not indispensable but may be omitted.

Figure 5:
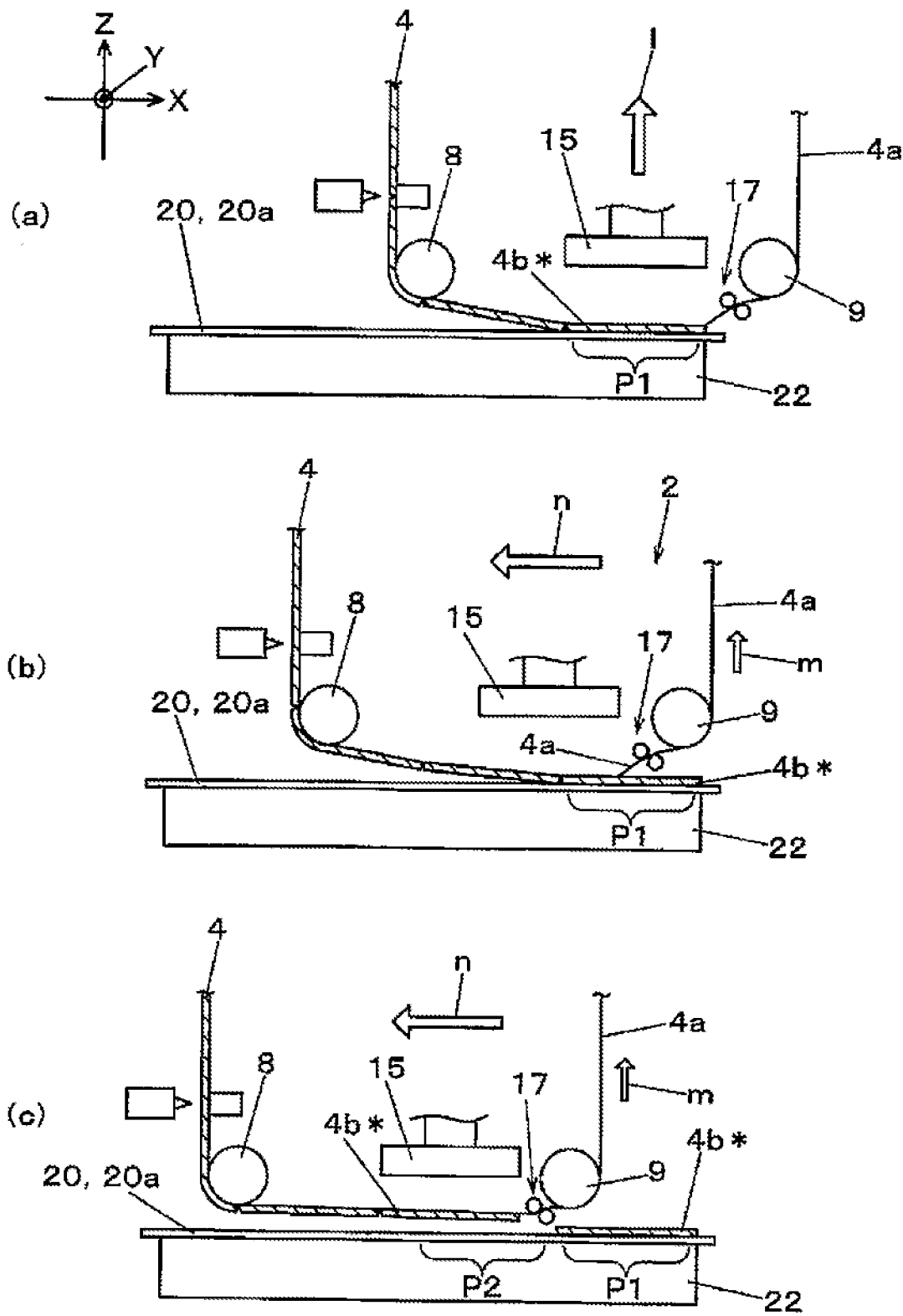
FIGS. 5(a), 5(b) and 5(c) are procedure illustrations of the tape attaching method of the embodiment of the present invention.

Then, when the pressing at the first press position P1 is completed, as shown in FIG. 5 (a), the press bonding head 15 will be raised (arrow l). Next, while the attaching unit containing the press bonding head 15 and the peeling unit 17 are integrally moved horizontally relative to the board 20 held on the board holding table 19 (arrow n) by driving the attachment unit moving mechanism 2b, as shows in FIG. 5 (b), the tape guiding unit is driven to perform the sending operation of the tape member 4 is performed (arrow m). During the relative movement in the X direction of the board holding table 19 and the peeling unit 17, with the relative movement of the first peeling roller 17a of the peeling unit 17 and the board 20, the separator 4a is peeled from the conductive tape piece 4b* attached on the attachment region 23 of the side edge part 20a of the board 20.

Figure 6:
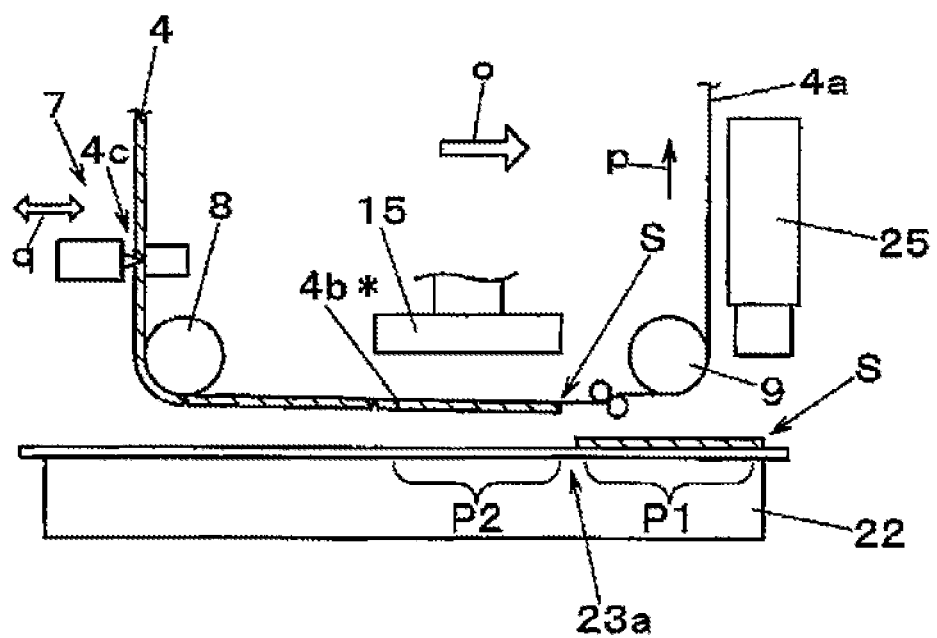
FIG. 6 is a procedure illustration of the tape attaching method of the embodiment of the present invention.

Then, an alignment for the next attachment region 23 is performed. In other words, as shown in FIG. 5(c), the peeling unit 17 is moved until the separator 4a is completely peeled from the conductive tape piece 41a* pressed at the first press position P1. At this time, since the press bonding head 15 is horizontally moved to a position away from the second press position, at the peeling, as shown in FIG. 6, the press bonding head 15 is moved to the opposite direction (arrow o) to be placed above the second press position P2. Meanwhile, by driving the tape sending mechanism 10 of the tape guiding unit to send the tape member 4 (arrow p), the attachment starting position S of the conductive tape piece 4b* which becomes the next attachment object is aligned with the attachment starting end 23a of the attachment region 23 (the next attachment region) corresponding to the second press position P2.

With these actions, by operating the cutting unit 7 (arrow q), a break 4c is newly formed in the tape member 4. By imaging the attachment starting position S of the attached conductive tape piece 4b* with the camera 25 to recognize the position, the match of the attachment position of the conductive tape piece 4b* is inspected. Then, for the attachment regions 23 respectively corresponding to the second press position P2 to the fourth press position P4, the steps after FIG. 4(c) are repeated in a similar manner.

Namely, in the tape attaching method, the attaching step in which one conductive tape piece 4b* is attached onto one attachment region 23, and the moving step, in which while the attaching unit and the peeling unit 17 are integrally moved relative to the board holding table 19 by driving the attachment unit moving mechanism 2b which is a relative moving unit, the tape guiding unit is driven to perform the operation of sending the tape member 4, so that the press bonding head 15 is aligned with the next attachment region 23 and the separator 4a is peeled from the anisotropic conductive tape 4b* attached onto the attachment region 23 by the peeling unit 17 during the relative movement, are repeated. That is, in the moving step, the peeling of the separator 4a and the alignment of the press bonding head 15 with the next attachment region 23 can be performed simultaneously, and it is possible to shorten the time which an peeling operation in the tape attaching operation takes.

Therefore, even when the plurality of electrode parts 21 are spaced and formed discontinuously as in a large-sized display panel on which the operation is performed, since the conductive tape 4b is attached only in the component connection range where the electrode parts 21 are formed in the side edge part 20*a* of the board 20, the tape peeling operation can be performed efficiently while the waste of the conductive tape 4*b* is eliminated, and productivity can be improved.

This application is based on the Japanese patent application (patent application 2010-137951) filed on Jun. 17, 2010, whose content is incorporated herein by reference.

INDUSTRIAL APPLICABILITY

The tape attaching device and the tape attaching method of the present invention have effects that the tape peeling operation is performed efficiently while the waste of the conductive tape is eliminated, and productivity can be improved, and is applicable in attaching a tape for mounting components onto a board, such as a display pane.

DESCRIPTION OF THE NUMBERS 1 tape attaching device
2 attaching mechanism
2*b* attachment unit moving mechanism
3 board positioning unit
4 tape member
4*a* separator
4*b* conductive tape
5 tape supply reel
7 cutting unit
8 first guide roller
9 second guide roller
10 tape sending mechanism
13 tape collecting unit
14 elevating mechanism
15 press bonding head
17 peeling unit
18 board moving mechanism
19 board holding table
20 board
20*a* side edge part
21 electrode part
22 lower receiving unit
23 attachment region
23*a* attachment starting end
B press length
P1 first press position
P2 second press position
S attachment starting position
L attachment length

The invention claimed is:

1. A tape attaching method which cuts an anisotropic conductive tape into conductive tape pieces of a predetermined attachment length, and attaches the conductive tape pieces onto a plurality of attachment regions which are formed at a side edge part of a board, and which is performed by a tape attaching device comprising a board holding table which holds the board, a tape guiding unit which guides a tape member, which is formed by laminating the anisotropic conductive tape on a separator, from a tape supplying unit to the attachment regions configured by a plurality of electrode units provided at the side edge part of the board along the longitudinal direction thereof, and sends the tape member, which becomes only the separator by attaching the anisotropic conductive tape onto the attachment regions, to the side of a tape collecting unit, a cutting unit which forms breaks at an interval corresponding to the attachment length in the attachment regions on the anisotropic conductive tape, an attaching unit which attaches the anisotropic conductive tape onto the attachment regions by pressing the tape member on the board, which is held on the board holding table and the side edge part of which is received from below by a lower receiving unit, with a press bonding head, a peeling unit which peels the separator from the anisotropic conductive tape attached by the attaching unit, a relative moving unit which horizontally moves the attaching unit and the peeling unit relative to the board holding table in a state that a relative position of the attaching unit and the peeling unit is kept, and a control unit which controls the relative moving unit, the tape guiding unit, the cutting unit, the attaching unit, and the peeling unit, the tape attaching method comprising:

an attaching step in which the conductive tape piece is attached onto one attachment region; and a moving step in which after the press bonding head is moved up, while the attaching unit and the peeling unit are integrally moved relative to the board holding table by driving the relative moving unit, the tape guiding unit is driven to perform the operation of sending the tape member, so that the press bonding head is aligned with the next attachment region, and while the relative movement is performed until a position where the separator is completely peeled from the anisotropic conductive tape attached onto the attachment region by the peeling unit during the relative movements, the press bonding head and the next conductive tape piece are aligned with the next attachment region, wherein the attaching step and the moving step are repeated, and wherein the separator is peeled from the anisotropic conductive tape during the relative movement.

* * * * *